US006992948B2

(12) United States Patent
Asada

(10) Patent No.: US 6,992,948 B2
(45) Date of Patent: Jan. 31, 2006

(54) MEMORY DEVICE HAVING ADDRESS GENERATING CIRCUIT USING PHASE ADJUSTMENT BY SAMPLING DIVIDED CLOCK TO GENERATE ADDRESS SIGNAL OF SEVERAL BITS HAVING ONE BIT CHANGED IN SEQUENTIAL ORDER

(75) Inventor: Hiroaki Asada, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 853 days.

(21) Appl. No.: 10/010,273

(22) Filed: Dec. 5, 2001

(65) Prior Publication Data

US 2002/0138243 A1 Sep. 26, 2002

(30) Foreign Application Priority Data

Mar. 22, 2001 (JP) ............................. 2001-083422

(51) Int. Cl.
*G11C 8/00* (2006.01)

(52) U.S. Cl. ................ 365/230.06; 365/233; 365/236; 365/239

(58) Field of Classification Search .......... 365/230.01, 365/230.06 O, 230.09, 233 X, 236 X, 239 X
See application file for complete search history.

(56) References Cited

U.S. PATENT DOCUMENTS

| 5,410,664 | A | | 4/1995 | Brooks et al. | |
| 5,497,353 | A | * | 3/1996 | Sato et al. | 365/230.05 |
| 5,602,778 | A | * | 2/1997 | Futatsuya et al. | 365/185.09 |
| 5,745,431 | A | | 4/1998 | Pontius et al. | |
| 5,986,942 | A | * | 11/1999 | Sugibayashi | 365/189.01 |
| 6,509,851 | B1 | * | 1/2003 | Clark et al. | 341/100 |

FOREIGN PATENT DOCUMENTS

| JP | 63-167496 | 7/1988 |
| JP | 8-63969 | 3/1996 |
| JP | 10-208477 | 8/1998 |
| JP | 2000-11638 | 1/2000 |

* cited by examiner

*Primary Examiner*—VanThu Nguyen
(74) *Attorney, Agent, or Firm*—Hamre, Schumann, Mueller & Larson, P.C.

(57) ABSTRACT

A semiconductor integrated circuit device is provided in which current consumption is reduced at the time a data access by consecutive addresses is performed to a ROM circuit or a RAM circuit. The semiconductor integrated circuit device incorporates a ROM circuit 1 and a control circuit 68 for controlling a data access to the ROM circuit, wherein an address generation circuit 69 included in the control circuit divides a clock to be input, performs a phase adjustment by sampling the divided clock and generates an address signal of several bits in which only a value of 1 bit changes in a sequential order when a data access by consecutive addresses is performed on the ROM circuit.

8 Claims, 15 Drawing Sheets

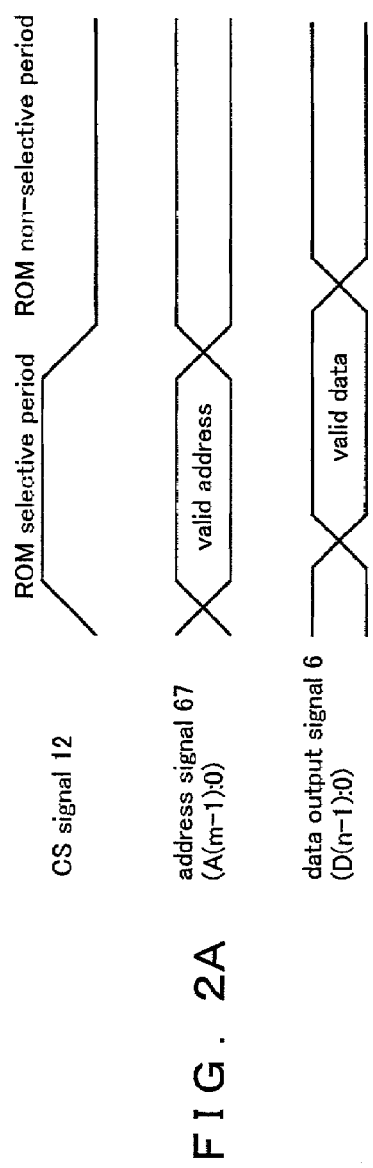
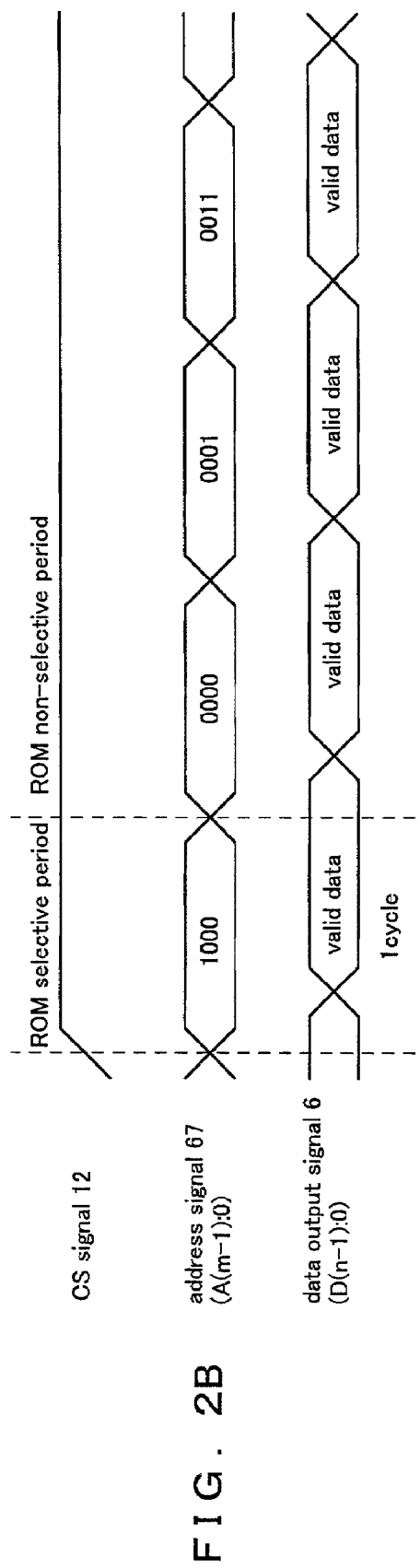
F I G. 2A
F I G. 2B

| A3 | A2 | A1 | A0 | a number of changing bits |
|----|----|----|----|---------------------------|
| 0  | 0  | 0  | 0  | 1 |
| 0  | 0  | 0  | 1  | 1 |
| 0  | 0  | 1  | 1  | 1 |
| 0  | 0  | 1  | 0  | 1 |
| 0  | 1  | 1  | 0  | 1 |
| 0  | 1  | 1  | 1  | 1 |
| 0  | 1  | 0  | 1  | 1 |
| 0  | 1  | 0  | 0  | 1 |
| 1  | 1  | 0  | 0  | 1 |
| 1  | 1  | 0  | 1  | 1 |
| 1  | 1  | 1  | 1  | 1 |
| 1  | 1  | 1  | 0  | 1 |
| 1  | 0  | 1  | 0  | 1 |
| 1  | 0  | 1  | 1  | 1 |
| 1  | 0  | 0  | 1  | 1 |
| 1  | 0  | 0  | 0  | 1 |
|    |    |    |    | total 16 |

FIG. 3

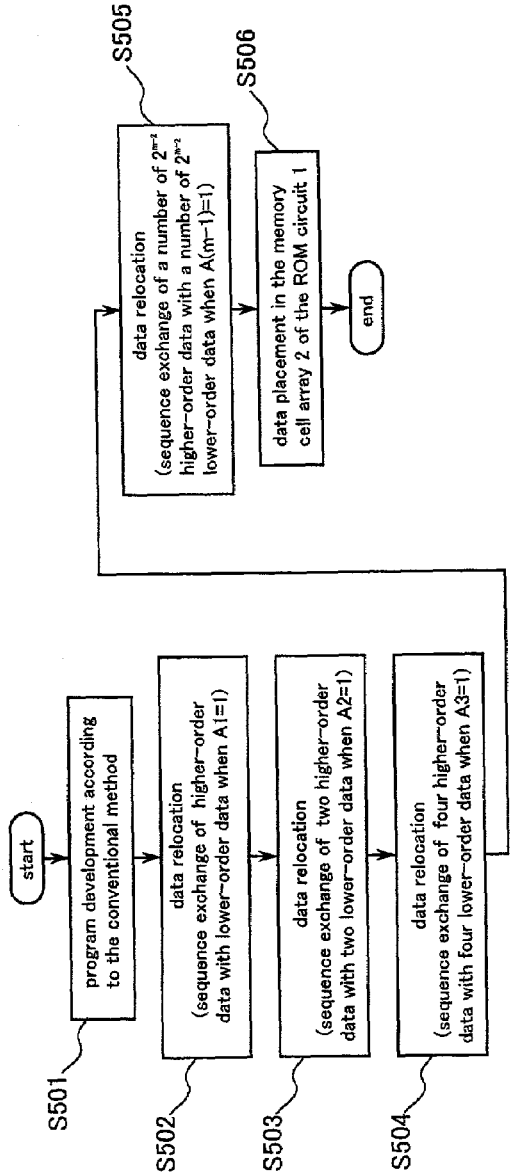

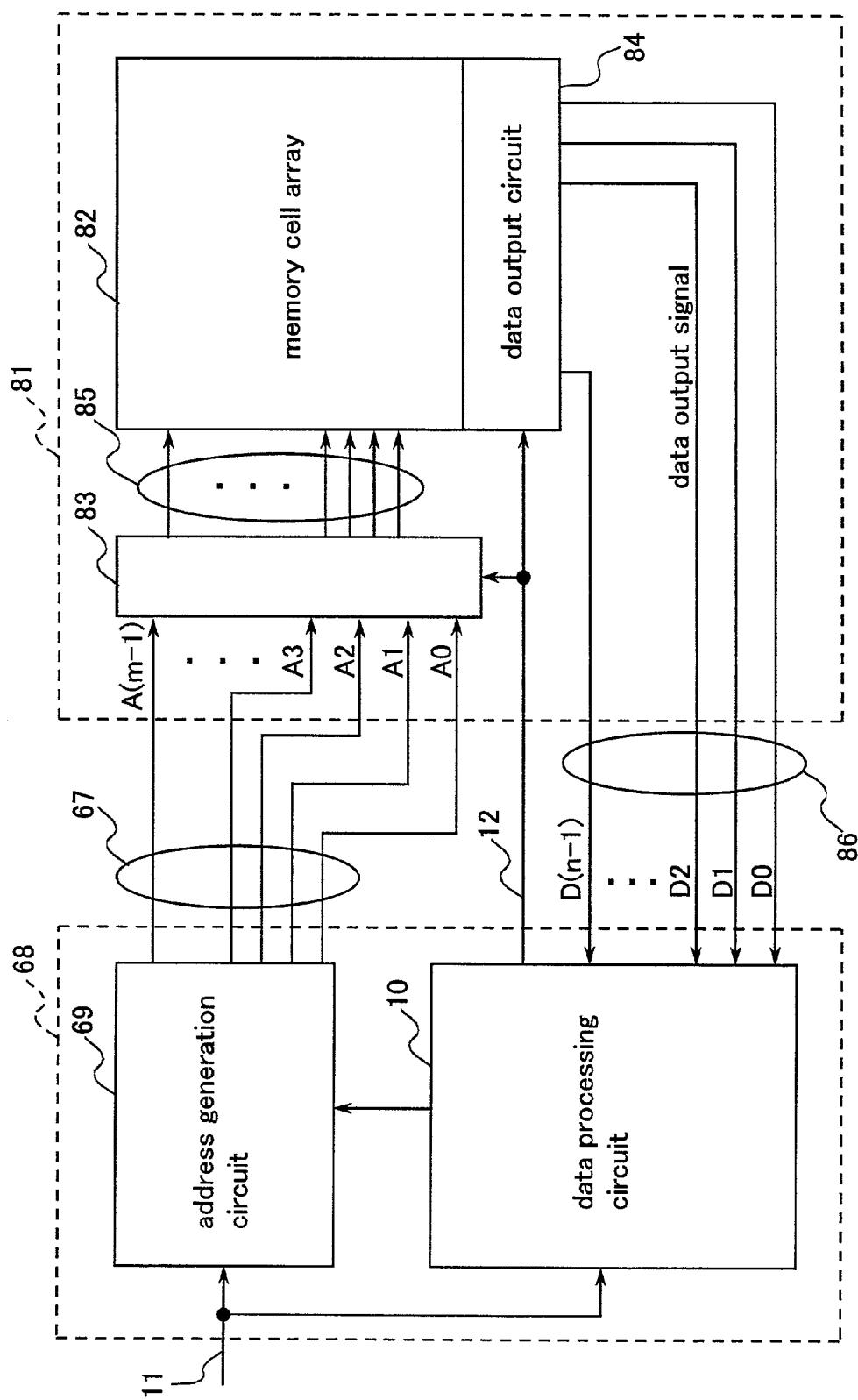
F I G. 7

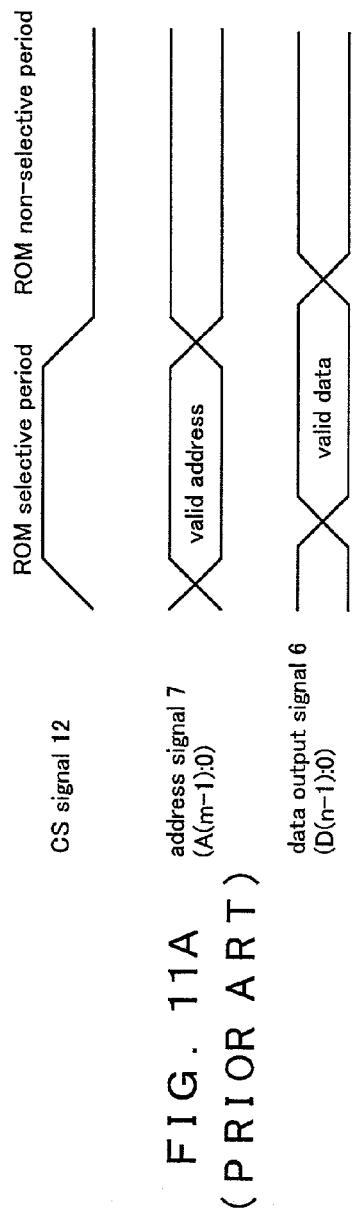
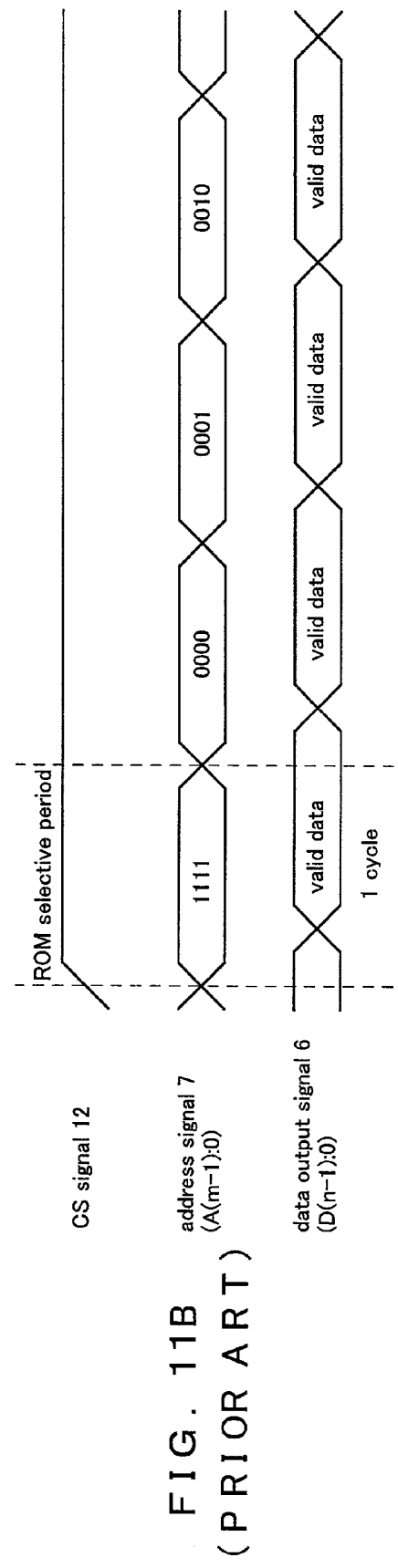
FIG. 11A (PRIOR ART)
FIG. 11B (PRIOR ART)

| A3 | A2 | A1 | A0 | a number of changing bits |
|---|---|---|---|---|
| 0 | 0 | 0 | 0 | 4 |
| 0 | 0 | 0 | 1 | 1 |
| 0 | 0 | 1 | 0 | 2 |
| 0 | 0 | 1 | 1 | 1 |
| 0 | 1 | 0 | 0 | 3 |
| 0 | 1 | 0 | 1 | 1 |
| 0 | 1 | 1 | 0 | 2 |
| 0 | 1 | 1 | 1 | 1 |
| 1 | 0 | 0 | 0 | 4 |
| 1 | 0 | 0 | 1 | 1 |
| 1 | 0 | 1 | 0 | 2 |
| 1 | 0 | 1 | 1 | 1 |
| 1 | 1 | 0 | 0 | 3 |
| 1 | 1 | 0 | 1 | 1 |
| 1 | 1 | 1 | 0 | 2 |
| 1 | 1 | 1 | 1 | 1 |
| | | | total | 30 |

FIG. 13

(PRIOR ART)

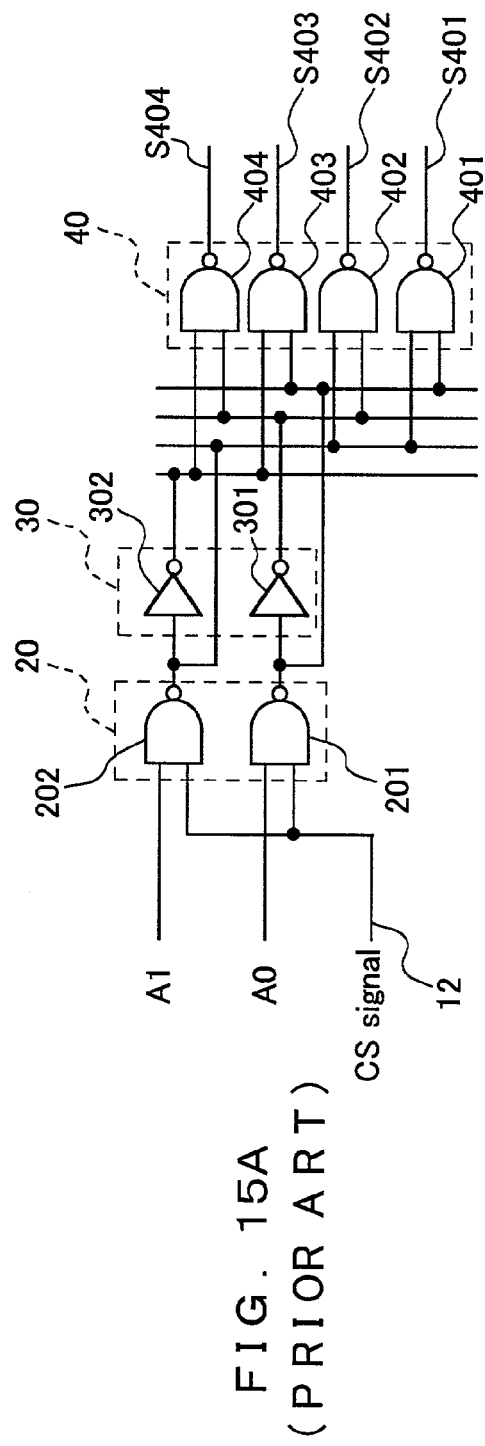
FIG. 15A (PRIOR ART)
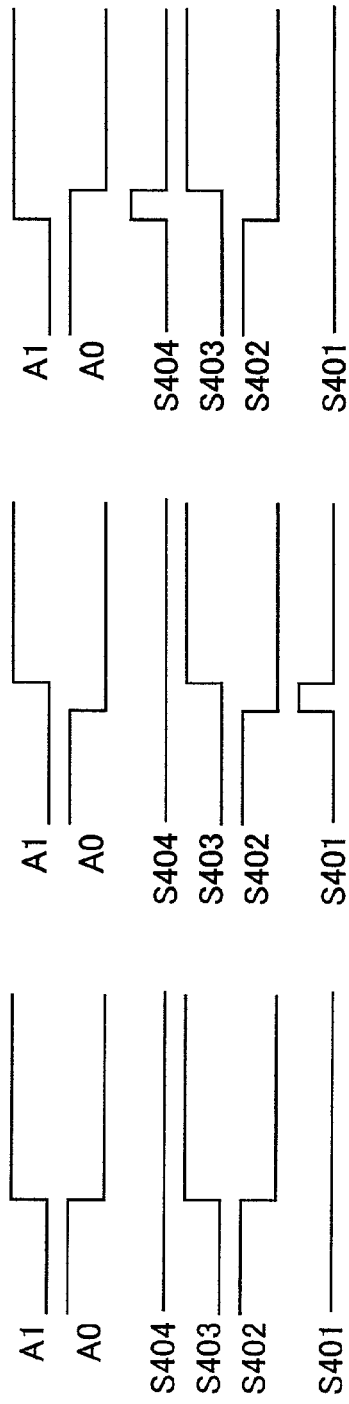
FIG. 15B (PRIOR ART)
FIG. 15C (PRIOR ART)
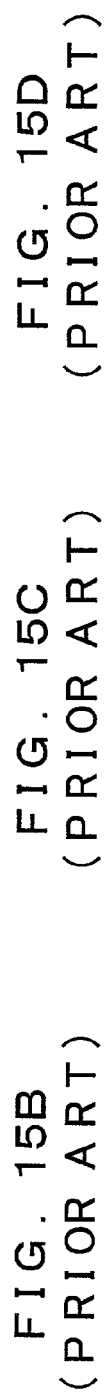
FIG. 15D (PRIOR ART)

MEMORY DEVICE HAVING ADDRESS GENERATING CIRCUIT USING PHASE ADJUSTMENT BY SAMPLING DIVIDED CLOCK TO GENERATE ADDRESS SIGNAL OF SEVERAL BITS HAVING ONE BIT CHANGED IN SEQUENTIAL ORDER

BACKGROUND OF THE INVENTION

1. Field of the Invention

The present invention relates to the technology of generating an address signal for controlling a ROM circuit or a RAM circuit incorporated into a semiconductor integrated circuit device, more specifically to the technology of reducing power consumption in such a semiconductor integrated circuit device.

2. Description of the Related Art

As a conventional example, a conventional semiconductor integrated circuit device incorporating a ROM circuit and a circuit for controlling the ROM circuit will be explained with reference to FIG. 10 to FIG. 12.

FIG. 10 is a block diagram showing the configuration of such a conventional semiconductor integrated circuit device.

In FIG. 10, the semiconductor integrated circuit device incorporates a ROM circuit 1 and a control circuit 8 for controlling the ROM circuit 1. The ROM circuit 1 includes a memory cell array 2 where memory cells for storing data are arranged in an array, an address decoding circuit 3 for decoding an address signal 7 to be input from the external control circuit 8, and a data output circuit 4 for outputting the data.

The control circuit 8 includes an address generation circuit 9 for generating the address signal 7 based on a clock 11 to be input from the outside and a data processing circuit 10 for processing a data output signal 6 to be output from the data output circuit 4 in the ROM circuit 1.

The number of bits of the data output signal 6 is determined by the configuration of the memory cell array 2. For example, when the minimum unit of memory is a byte (8 bits) unit, the data output signal 6 has 8 bits (n=8, D7 to D0), whereas when the minimum unit of memory is a word (16 bits) unit, the data output signal 6 has 16 bits (n=16, D15 to D0). Furthermore, the number of bits of the address signal 7 is determined by the memory capacity of the memory cell array 2. For example, when the minimum unit of memory is the byte unit and the memory capacity is 1 K byte, the address signal 7 will have 10 bits (m=10, A9 to A0), whereas for memory capacity of 64 K bytes, the address signal 7 will have 16 bits (m=16, A15 to A0).

When the control circuit 8 reads out data from the ROM circuit 1, the control circuit 8 outputs a CS signal (chip select signal) 12 showing that the ROM circuit 1 is selected and the address signal 7. The address signal 7 is input to the address decoding circuit 3 in the ROM circuit 1 and converted into a word line 5 that selects a specific address in the memory cell array 2. Data of the specific address in the memory cell array 2 shown by the word line 5 are output through the data output circuit 4. The data output signal 6 is input to the data processing circuit 10 in the control circuit 8, where processing is performed in accordance with the data.

Here, timing of the CS signal 12, the address signal 7 and the data output signal 6 will be explained with reference to FIG. 11A and FIG. 11B.

FIG. 11A shows signal timing when the control circuit 8 reads out data only once from the ROM circuit 1. In FIG. 11A, first, the data processing circuit 10 in the control circuit 8 outputs the CS signal 12, and the address generation circuit 9 outputs the address signal 7. During a period in which the CS signal 12 is in the logic "H" level (ROM selective period), the ROM circuit 1 judges that the input address signal 7 is a valid address and outputs valid data to the data processing circuit 10 in the control circuit 8.

Furthermore, FIG. 11B shows signal timing when the control circuit 8 reads out data continuously from the ROM circuit 1. In FIG. 11B, once the CS signal 12 reaches the logic "H" level, the logic "H" level is maintained during a period in which data are read out continuously. The address signal 7 is incremented every time data are read out from the ROM circuit 1 (that is, for each cycle). FIG. 11B shows the timing of change of only four low-order bits (A3 to A0). As an example, the four low-order bits (A3 to A0) in the address signal change from 1111→0000→0001→0010. Valid data corresponding to these address signals are output to the data processing circuit 10 in the control circuit 8 in a sequential order.

Here, a period during which the CS signal 12 is in the logic "H" level is determined to be the ROM selective period, whereas a period during which the CS signal 12 is in the logic "L" level is determined to be a ROM non-selective period, but the polarity is optional and depends on the ROM circuit 1.

Next, the address generation circuit 9 in the control circuit 8 will be explained further with reference to FIG. 12A and FIG. 12B. FIG. 12A is a block diagram showing the configuration of the address generation circuit 9, and FIG. 12B is a timing chart of the address signal 7 with respect to the clock 11. In addition, only four low-order bits of A3 to A0 are shown as examples as the address signal 7 in FIG. 12B.

In FIG. 12A, the address generation circuit 9 includes a counter circuit 16 that divides the clock 11 entering from the outside. When the address signal 7 has m bits (m is an integer), the number of stages in the counter circuit 16 is m. The clock 11 is divided by ½ into a signal A0, divided by $(½)^2$ (=¼) into a signal A1, divided by $(½)^3$ (=⅛) into a signal A2, divided by $(½)^4$ (=1/16) into a signal A3 and divided further by ½ in a sequential order until it reaches a signal of A (m−1), which is a signal divided by $(½)^m$. These signals respectively are output through an output buffer 17.

As shown in FIG. 12B, the counter circuit 16 performs a count-up operation at the trailing edge of the clock 11, so that each address signal changes. In addition, it is also possible to count at the leading edge of the clock 11.

However, in the conventional semiconductor integrated circuit device as described above, when data are read out continuously from the ROM circuit 1, the probability that the address signal 7 changes becomes approximately 50%. Thus, there was a problem that current consumed in the address decoding circuit 3 of the ROM circuit 1 and in the address generation circuit 9 of the control circuit 8 is increased.

This aspect will be explained with reference to FIG. 13, FIG. 14, FIG. 16A, FIG. 15B, FIG. 15C and FIG. 15D.

FIG. 13 is a transition table for the address signal 7 in the address generation circuit 9 of FIG. 12A. Here, only four low-order bits of A3 to A0 are shown as examples as the address signal 7. In FIG. 13, when the address signal 7 changes from 0000 to 0001, the number of changing bits is 1 since only the lowest-order bit A0 has changed from 0 to 1. When the address signal 7 changes from 0111 to 1000, the number of changing bits is 4 since all the bits have changed. Furthermore, with respect to the state of 0000 in the first line of FIG. 13, the number of changing bits also is 4 since the prior state is 1111.

Therefore, when data are read out continuously from the ROM circuit 1, the average number of changing bits of the address signal during 16 cycles showing FIG. 13 becomes (4+1+2+1+3+1+2+1+4+1+2+1+3+1+2+1)/16=30/16≈2 bits.

Furthermore, the average probability of change becomes 2 bits/4 bits=50%. Also when the number of bits of the address signal 7 increases, the probability of change of the address signal 7 becomes 50% in average.

Next, the effects of such changes in the address signal on current consumption will be explained with reference to FIG. 14.

FIG. 14 is a circuit diagram showing a configuration example of the address decoding circuit 3 in the ROM circuit 1, in which only decoding circuits of the four low-order bits of A3 to A0 in the address signal 7 are shown. In FIG. 14, each signal A3 to A0 is controlled by the CS signal 12 showing that the ROM circuit 1 is selected and becomes effective when the CS signal 12 is in the logic "H" level.

When the CS signal 12 is in the logic "H" level, inverse signals and non-inverse signals of A3 to A0 are generated by a NAND circuit group 20 including 4 pieces of two-input NAND circuits and an inverter circuit group 30 including 4 pieces of inverter circuits. A NAND circuit group 40 serves as the decoding circuit for A1 and A0, and a NAND circuit group 41 serves as the decoding circuit for A3 and A2. The signals decoded in the NAND circuit groups 40, 41 are converted to 16 lines of decoding signals of A3 to A0 by a NOR circuit group 50 further including 16 pieces of two-input NOR circuits.

For example, a two-input NOR circuit 501 outputs the logic "H" level (that is, showing that this is selected, and other combinations are not selected) when A3 to A0 are all in the logic "L", whereas a two-input NOR circuit 502 outputs the logic "H" level (that is, showing that this is selected, and other combinations are not selected) when A3 to A0 are all in the logic "H" level.

These 16 lines of signals are combined with the decoded results of higher-order address signals and finally become a signal of the word line 5.

Here, when the control circuit 8 reads out data continuously from the ROM circuit 1, the CS signal 12 is always in the logic "H" level. Therefore, along with changes in the address signal 7, signal inversions inevitably occur in the two-input NAND circuits of the NAND circuit group 20 described above and in the inverter circuits of the inverter circuit group 30 connected thereto, and current is consumed. Furthermore, signal inversions occur also in the NAND circuit groups 40, 41 and in the NOR circuit group 50 due to combinations of signals.

Furthermore, when a plurality of address signals change simultaneously, circuits that are not inverted statically may be inverted dynamically. This aspect will be explained with reference to FIG. 15.

FIG. 15A is a circuit diagram showing the decoding part related to A1 and A0 excerpted from the address decoding circuit 3 shown in FIG. 14. FIG. 15B, FIG. 15C and FIG. 15D respectively are timing charts of output signals from two-input NAND circuits 401 to 404, in which FIG. 15B shows a case where A1 and A0 change simultaneously, FIG. 15C shows a case where A1 changes later than A0, and FIG. 15D shows a case where A0 changes later than A1.

As shown in FIG. 15B, when A1 changes from 0 to 1 and A0 changes from 1 to 0 exactly at the same time, an output signal S402 from the two-input NAND circuit 402 only changes from 1 to 0, and an output signal S403 from the two-input NAND circuit 403 only changes from 0 to 1.

However, as shown in FIG. 15C and FIG. 15D, the two-input NAND circuits 401 and 404 also operate during a period in which either one of the two input signals is slightly delayed due to a difference in the wiring delay arising from the mask layout or a difference in the number of stages in the circuit from the address signal to the input, and current is consumed (this is generally called a hazard). In addition, the output signals (the output signal S401 in FIG. 15C, and the output signal S404 in FIG. 15D) are inverted twice during this slight delay.

In the case where the average probability of change in the address signal is as high as 50%, such hazards occur frequently inside the address decoding circuit 3. In this way, current consumption in the address decoding circuit 3 is increased. Usually, 20 to 30% of the current consumed in the ROM circuit 1 is consumed inside the address decoding circuit 3.

Furthermore, wiring for the address signal 7 installed between the control circuit 8 and the ROM circuit 1 tends to be long in distance due to the mask layout, and the load capacitance is increased. The higher the average probability of change in the address signal 7, the more current is consumed in the output buffer 17 (a total of m pieces) of the address generation circuit 9.

SUMMARY OF THE INVENTION

It is an object of the present invention to solve the above-mentioned conventional problems by providing a semiconductor integrated circuit device in which lower power consumption is achieved as a whole by reducing current consumption in an address generation circuit and in an address decoding circuit when a data access by consecutive addresses is performed on a ROM circuit or a RAM circuit.

Furthermore, another object of the present invention is to provide a semiconductor integrated circuit device in which lower power consumption is achieved as a whole by reducing current consumption in a counter timer circuit that outputs count values continuously.

In order to achieve the above-mentioned object, a first semiconductor integrated circuit device of the present invention is a semiconductor integrated circuit device incorporating a semiconductor memory circuit and a control circuit for controlling a data access to the semiconductor memory circuit, wherein the control circuit outputs an address signal of several bits in which only a value of 1 bit changes in a sequential order when a data access by consecutive addresses is performed on the semiconductor memory circuit. In this case, the semiconductor memory circuit includes a ROM circuit, a RAM circuit or both circuits.

According to this configuration, it is possible to reduce significantly the current consumed when the control circuit performs a data access by consecutive addresses to the semiconductor memory circuit. Moreover, in a case where both a ROM circuit and a RAM circuit are included as the semiconductor memory circuit, both circuits can be controlled by one control circuit, so that it is more effective.

In order to achieve the above-mentioned object, a second semiconductor integrated circuit device of the present invention is a semiconductor integrated circuit device incorporating a semiconductor memory circuit and a control circuit for controlling a data access to the semiconductor memory circuit, wherein the control circuit includes an address generation circuit, and the address generation circuit outputs an address signal of several bits in which only a value of 1 bit changes in a sequential order when a data access by consecutive addresses is performed on the semiconductor memory circuit. In this case, the semiconductor memory circuit includes a ROM circuit, a RAM circuit or both circuits.

According to this configuration, in addition to the advantage of the first semiconductor integrated circuit, an address signal of several bits in which only a value of 1 bit changes in a sequential order can be generated only with the address generation circuit without using a conversion circuit or the like.

In order to achieve the above-mentioned object, a third semiconductor integrated circuit device of the present invention is a semiconductor integrated circuit device incorporating a semiconductor memory circuit and a control circuit for controlling a data access to the semiconductor memory circuit, wherein the control circuit includes an address generation circuit that divides a clock to be input, performs a phase adjustment by sampling the divided clock and generates an address signal of several bits, and the address generation circuit outputs the address signal of several bits in which only a value of 1 bit changes in a sequential order when a data access by consecutive addresses is performed on the semiconductor memory circuit. In this case, the semiconductor memory circuit includes a ROM circuit, a RAM circuit or both circuits.

According to this configuration, in addition to the advantage of the second semiconductor integrated circuit, when a count value from a counter is converted by a conversion circuit made of combined circuits into an address signal of several bits in which only a value of 1 bit changes in a sequential order, hazards inconveniently occurring due to a delay of signal transition in the combined circuits can be eliminated.

In order to achieve the above-mentioned object, a fourth semiconductor integrated circuit device of the present invention is a semiconductor integrated circuit device incorporating a semiconductor memory circuit and a control circuit for controlling a data access to the semiconductor memory circuit, wherein the control circuit includes an address generation circuit that divides a clock to be input and generates an address signal of several (m) bits in which bit 0 is set as a lowest-order bit, and the address generation circuit outputs an address signal of several bits in which only a value of 1 bit changes in a sequential order by dividing the clock by $(1/4) \times (1/2)^i$ to generate bit i (i=0 to (m-1)) and delaying a phase of each bit by $1/4$ cycle with respect to a cycle of an immediately lower-order bit when a data access by consecutive addresses is performed on the semiconductor memory circuit. In this case, the semiconductor memory circuit includes a ROM circuit, a RAM circuit or both circuits.

According to this configuration, in addition to the advantage of the third semiconductor integrated circuit, it is possible to achieve easily an address generation circuit generating an address signal in which only 1 bit changes with respect to continuous changes in addresses.

The second, third and fourth semiconductor integrated circuit devices preferably include means for converting a location of data stored in the semiconductor memory circuit into a location corresponding to a change in the address signal from the address generation circuit.

According to this configuration, a program developed by the conventional method that is stored in the semiconductor memory circuit can be executed by the control circuit without making any changes to the semiconductor memory circuit.

In order to achieve the above-mentioned object, a fifth semiconductor integrated circuit device of the present invention is a semiconductor integrated circuit device incorporating a timer counter circuit, wherein the timer counter circuit includes a counter circuit that divides a clock to be input by a predetermined division rate and outputs a plurality of divided clocks, a counter register that stores a divided clock corresponding to an immediately higher-order bit as data based on a divided clock corresponding to a low-order bit to be output from the counter circuit and outputs a count value in which only a value of 1 bit changes in a sequential order, a compare register that stores a predetermined comparison set value, and a compare circuit that compares the count value from the counter register with the predetermined comparison set value from the compare register and outputs a comparison result thereof.

According to this configuration, current consumption in the timer counter circuit that measures time according to the compare register system can be reduced.

In this case, it is preferable that the fifth semiconductor integrated circuit device includes means for converting the comparison set value stored in the compare register into a value corresponding to a change in the count value from the counter register.

According to this configuration, a program developed by the conventional method can be executed without making any changes to the compare register and the compare circuit.

BRIEF DESCRIPTION OF THE DRAWINGS

FIG. 2A is a timing chart showing a CS signal, an address signal and a data output signal when data are read out only once from a ROM circuit 1 in the semiconductor integrated circuit device of FIG. 1.

FIG. 2B is a timing chart showing a CS signal, an address signal and a data output signal when data are read out continuously from the ROM circuit 1 in the semiconductor integrated circuit device of FIG. 1.

FIG. 3 is a transition table of four low-order bits of an address signal in an address generation circuit 69 of FIG. 1.

FIG. 5A is a flow chart showing the process of relocating data to the ROM circuit 1 according to a second embodiment of the present invention.

FIG. 5B is a table showing the contents of data to be relocated following the steps shown in FIG. 5A.

FIG. 5C is a table showing the contents of data when a program is executed.

FIG. 7 is a block diagram showing the configuration of a semiconductor integrated circuit device according a third embodiment of the present invention.

FIG. 11A is a timing chart showing a CS signal, an address signal and a data output signal when data are read out only once from the ROM circuit 1 in the semiconductor integrated circuit device of FIG. 10.

FIG. 11B is a timing chart showing a CS signal, an address signal and a data output signal when data are read out continuously from the ROM circuit 1 in the semiconductor integrated circuit device of FIG. 10.

FIG. 13 is a transition table of four low-order bits of an address signal in the conventional address generation circuit 9.

FIG. 15A is a circuit diagram showing the partial configuration of the address decoding circuit in FIG. 14.

FIG. 15B is a timing chart showing output signals from two-input NAND circuits 401 to 404 of FIG. 15A in a case where A1 and A0 change simultaneously.

FIG. 15C is a timing chart showing output signals from two-input NAND circuits 401 to 404 of FIG. 15A in a case where A1 changes later than A0.

FIG. 15D is a timing chart showing output signals from two-input NAND circuits 401 to 404 of FIG. 15A in a case where A0 changes later than A1.

DESCRIPTION OF THE PREFERRED EMBODIMENTS

Hereinafter, the preferred embodiments of the present invention will be described with reference to the drawings.

First Embodiment

First, a semiconductor integrated circuit device having a built-in ROM circuit will be explained as a first embodiment of the present invention with reference to FIG. 1 to FIG. 4.

Figure 1:
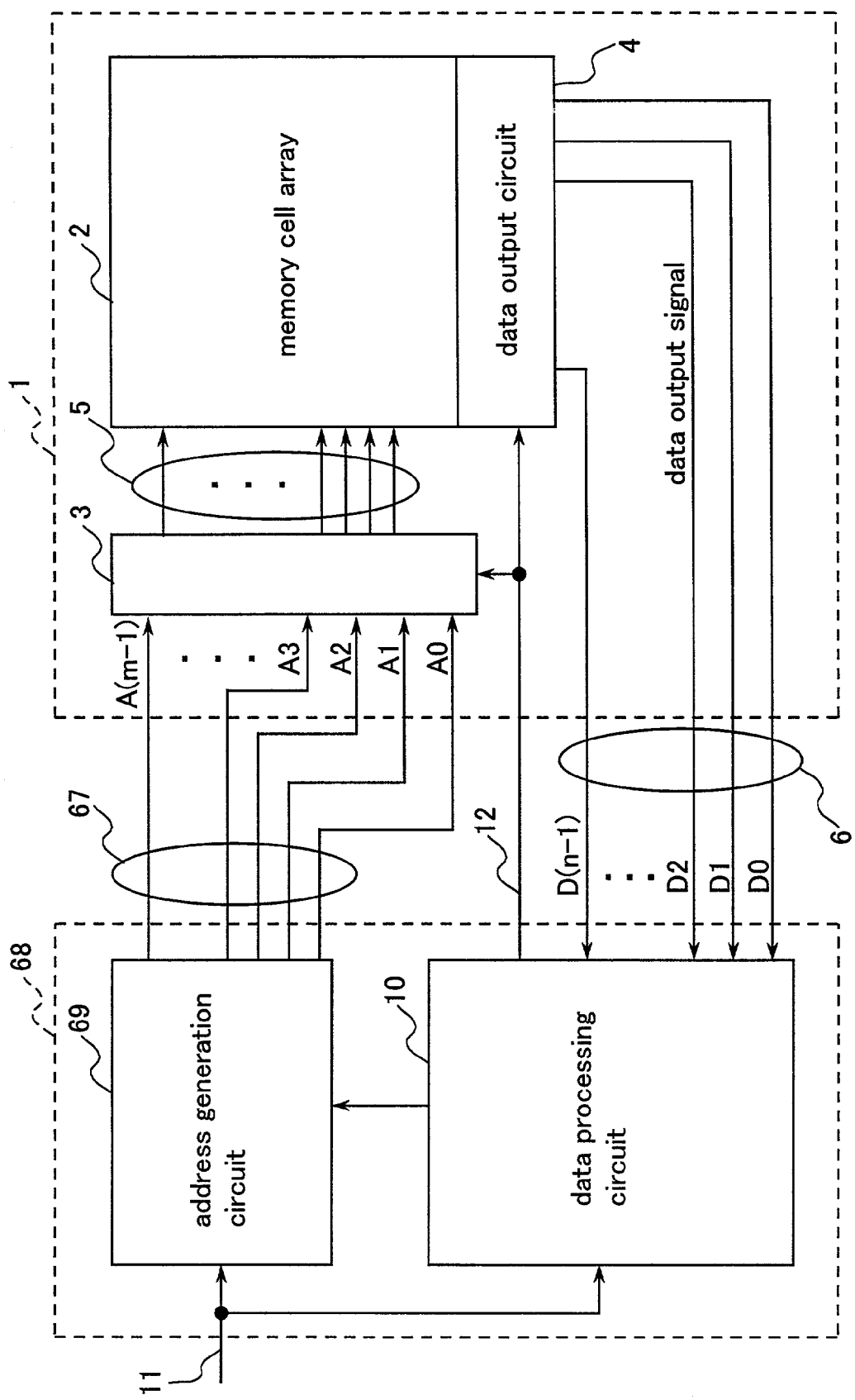
FIG. 1 is a block diagram showing the configuration of a semiconductor integrated circuit device according a first embodiment of the present invention.
Figure 10:
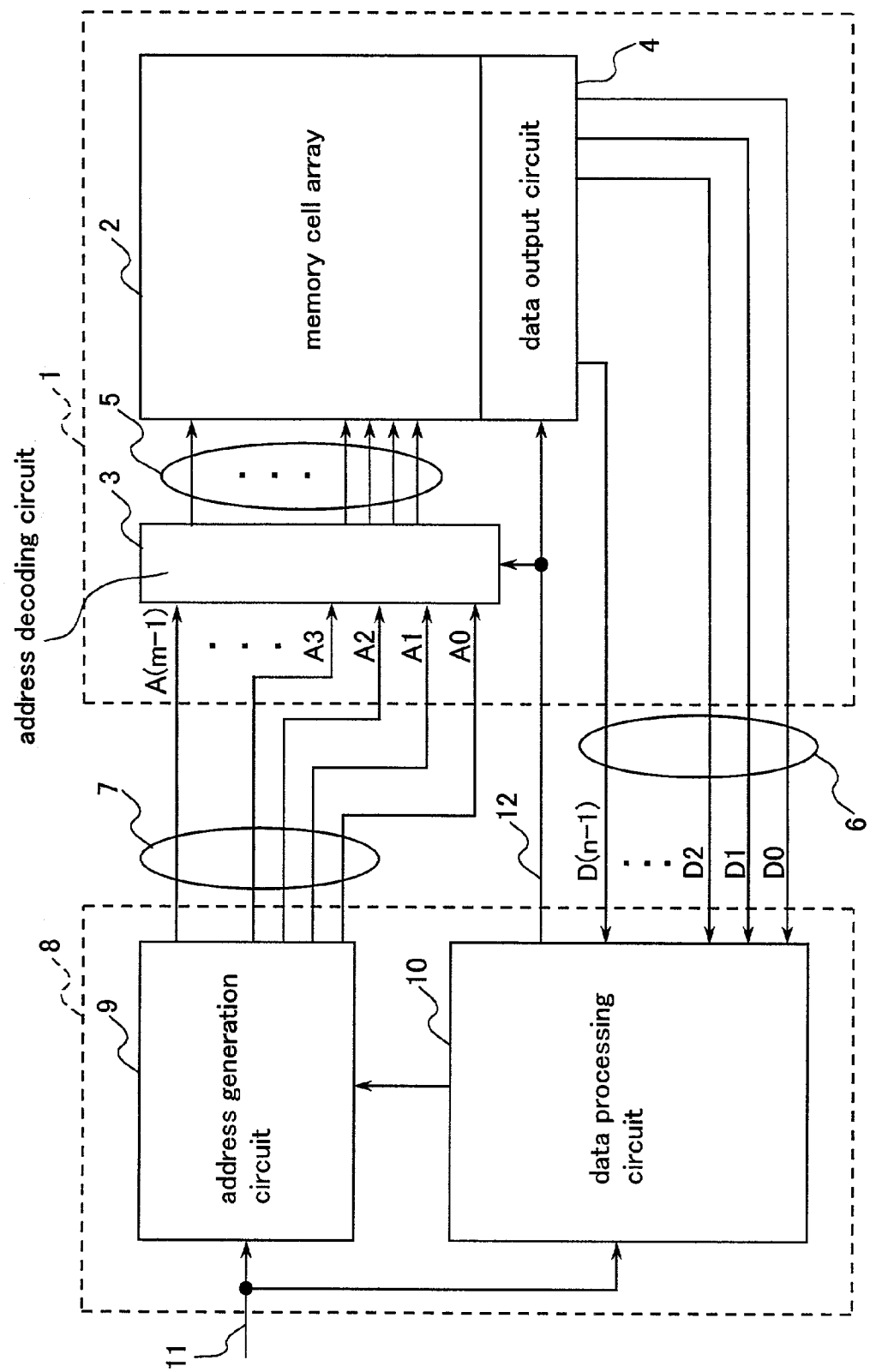
FIG. 10 is a block diagram showing the configuration of a conventional semiconductor integrated circuit device.

FIG. 1 is a block diagram showing the configuration of a semiconductor integrated circuit device according the first embodiment of the present invention. In FIG. 1, the components similar to those already described in FIG. 10 have been given the same reference numerals, and the explanations thereof are omitted. The present embodiment differs from the conventional example with respect to an internal structure of an address generation circuit 69 included in a control circuit 68 and timing of an address signal 67 to be output from the address generation circuit 69 when data are read out from the ROM circuit 1 by consecutive addresses.

Here, the timing of a CS signal 12, the address signal 67 and a data output signal 6 will be explained with reference to FIG. 2A and FIG. 2B.

FIG. 2A is a chart showing signal timing when the control circuit 68 reads out data only once from the ROM circuit 1, and FIG. 2B is a chart showing signal timing when the control circuit 68 reads out data continuously from the ROM circuit 1.

As shown in FIG. 2A, when the control circuit 68 reads out data only once from the ROM circuit 1, the address signal is the same as that in the conventional example of FIG. 11A.

However, as shown in FIG. 2B, when the control circuit 68 reads out data from the ROM circuit 1 by consecutive addresses, the address signal 67 to be output from the address generation circuit 69 in a sequential order is different from that in the conventional example.

In other words, every time data are read out from the ROM circuit 1 (that is, for each cycle), four low-order bits (A3 to A0) of the address signal 67 shown as an example change from 1000→0000 (only A3 changes from 1 to 0)→0001 (only A0 changes from 0 to 1)→0011 (only A1 changes from 0 to 1). Valid data corresponding to these addresses are output to the data processing circuit 10 of the control circuit 8 in a sequential order.

Thus, only 1 bit changes in the address signal 67 of several (m) bits.

FIG. 3 shows this state in the form of a transition table for the address signal 67. As shown in FIG. 3, only 1 bit ever changes in the address signal of several (m) bits. Accordingly, while the average probability of change in the address signal 7 of the conventional address generation circuit 9 is 50%, the rate of change in the address signal 67 of the address generation circuit 69 according to the present embodiment becomes 1 bit/m bit=1/m. In other words, it is 10% when m=10 and about 6% when m=16, so that the rate of change in the address signal is reduced significantly compared to 50% in the conventional example (that does not depend on m).

Figure 14:
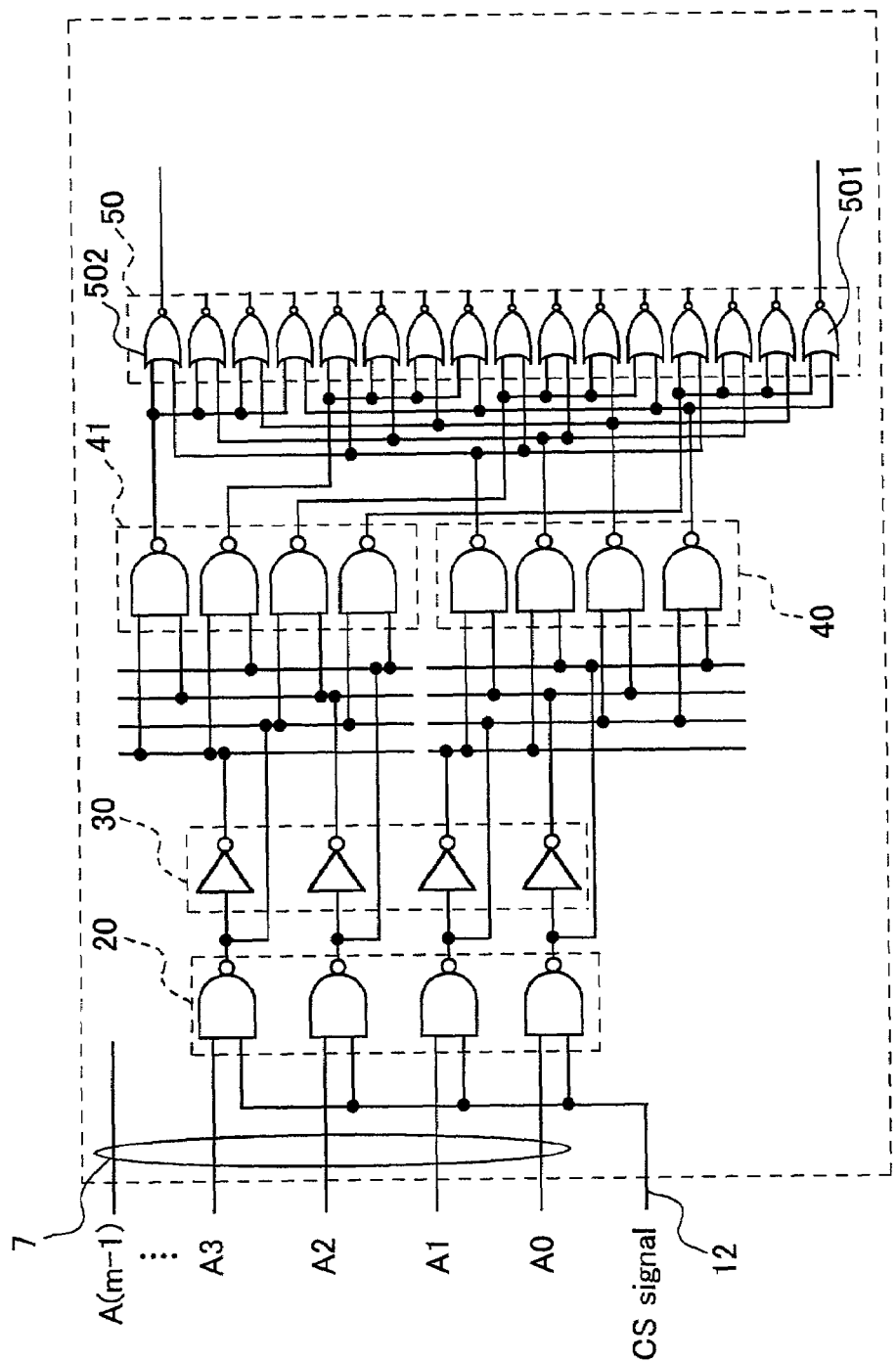
FIG. 14 is a circuit diagram showing the partial configuration of an address decoding circuit.

Thus, the rate of change in the address signal 67 is reduced significantly, so that the current consumed in the address decoding circuit 3, as explained with reference to FIG. 14, decreases largely. Furthermore, since the address signal changes only by 1 bit, it is impossible for the circuit to operate as a result of hazards explained with reference to FIG. 15A to FIG. 15D.

Usually, 20 to 30% of the current consumed in the ROM circuit 1 is consumed inside the address decoding circuit 3, but according to the present embodiment, the current consumption is reduced to not more than about10%.

Here, the address generation circuit 69 included in the control circuit 68 will be explained further with reference to FIG. 4.

Figures 4A, 4B:
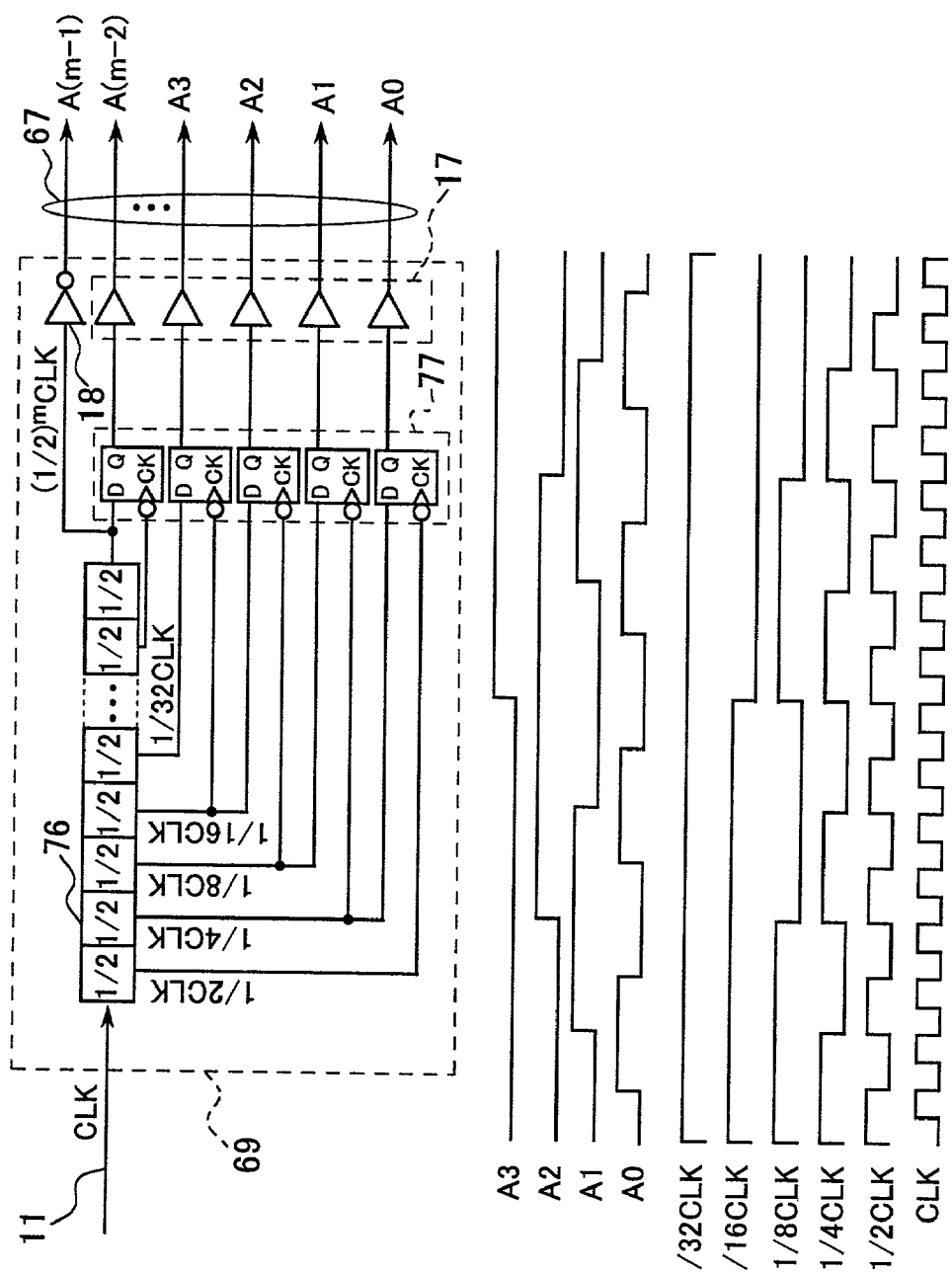
FIG. 4A is a block diagram showing the configuration of the address generation circuit 69 of FIG. 1.
FIG. 4B is a timing chart showing a clock, a divided clock and an address signal in the address generation circuit 69 of FIG. 1.

In FIG. 4, the address generation circuit 69 includes a counter circuit 76 that divides the clock (CLK) 11 entering from the outside and a sampling circuit 77 that performs a phase adjustment by sampling outputs from the counter circuit 76. When the address signal 67 has m bits (m is an integer), the number of stages in the counter circuit 76 is m. The counter circuit 76 generates the ½ divided clock (½ CLK), the ¼ divided clock (¼ CLK) . . . to the (½)$^m$ divided clock ((½)$^m$CLK). Here, the counter circuit 76 uses the system of performing a count-down operation at the trailing edge of the clock 11.

Figure 12A:
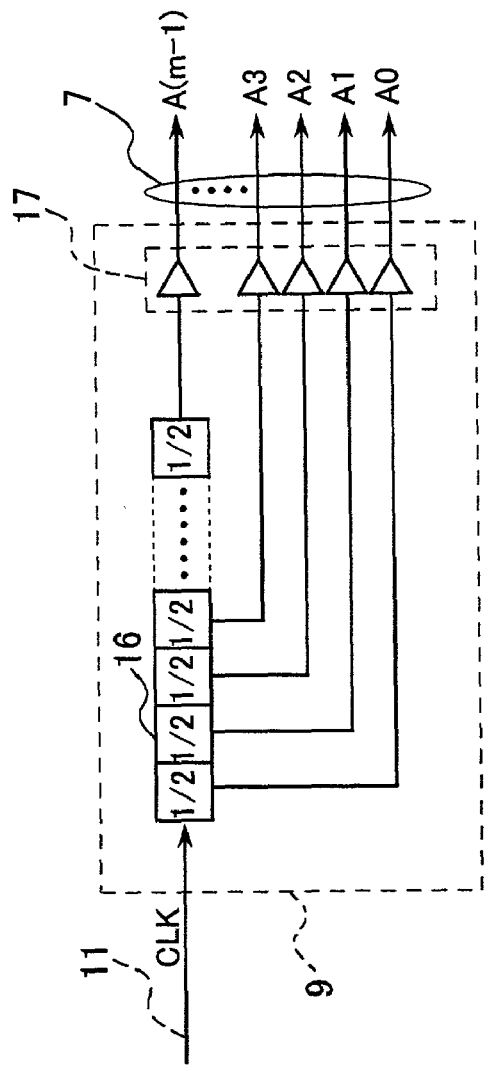
FIG. 12A is a block diagram showing the configuration of a conventional address generation circuit 9.
Figure 12B:
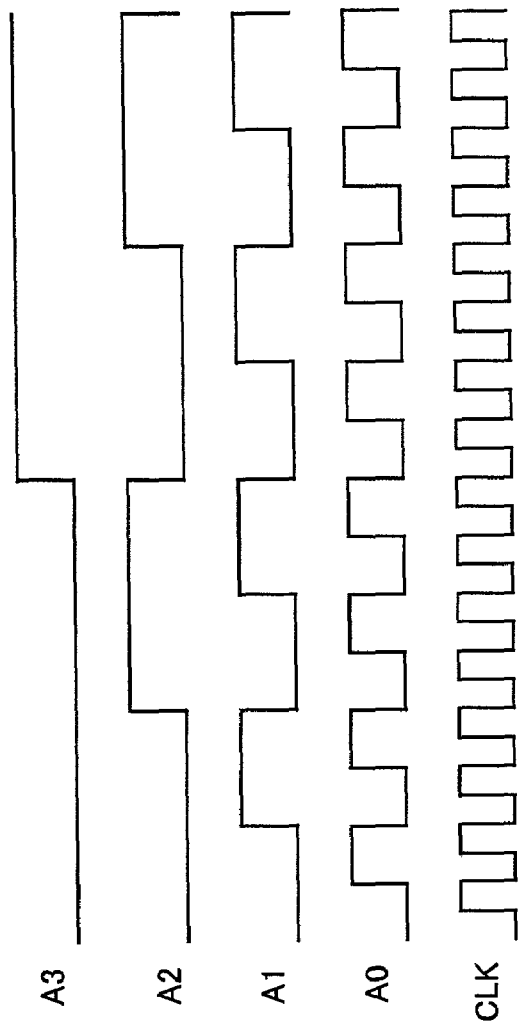
FIG. 12B is a timing chart showing a clock and an address signal in the conventional address generation circuit 9.

In the conventional example, as explained with reference to FIG. 12A and FIG. 12B, the divided clock was output as the address signal 7 as is through the output buffer 17. However, according to the address generation circuit 69 in the present embodiment, the divided clock is output as the address signal 67 through the sampling circuit 77 and the output buffer 17. Each divided clock is subjected to a phase adjustment by the sampling circuit 77 and performs a logic transition shown in the address transition table of FIG. 3.

For example, the lowest-order bit A0 in the address signal 67 is a signal obtained by sampling the ¼ divided clock (¼

CLK) at the trailing edge of the ½ divided clock (½ CLK). In other words, the lowest-order bit A0 becomes a signal obtained by delaying the ¼ divided clock (¼ CLK) by ¼ cycle.

Hereinafter, signals up to the second bit from the highest-order bit of A (m−2) are generated in the same manner. That is, A1 is a signal obtained by delaying the ⅛ divided clock (⅛ CLK) by ¼ cycle, A2 is a signal obtained by delaying the ¹⁄₁₆ divided clock (¹⁄₁₆ CLK) by ¼ cycle, A3 is a signal obtained by delaying the ¹⁄₃₂ divided clock (¹⁄₃₂ CLK) by ¼ cycle, and the second bit from the highest-order bit A (m−2) is a signal obtained by delaying the $(½)^m$ divided clock $((½)^m$CLK) by ¼ cycle.

In addition, it is also possible to generate the highest-order bit A (m−1) in the same manner, but in view of the fact that one more stage is needed as the number of stages in the counter circuit 76 and that it is necessary to return to an initial value after counting for $2^m$ times, a signal obtained by inverting the $(½)^m$ divided clock with an output buffer 18 is used as the highest-order bit A (m−1).

As a result, when the control circuit 68 reads out data from the ROM circuit 1 by consecutive addresses, the address generation circuit 69 that generates the address signal 67 of several bits in which only 1 bit changes in a sequential order can be constructed easily.

In addition, the circuit scale becomes larger due to a part added as the sampling circuit 77, but it presents no problem since the current consumed in the output buffers 17 and 18 connected to large load capacitor is the dominant factor in the current consumed in the address generation circuit 69.

Second Embodiment

Next, a second embodiment of the present invention will be explained with reference to FIG. 5A, FIG. 5B, FIG. 5C, FIG. 6A and FIG. 6B.

Usually, data stored in the memory cell array 2 of the ROM circuit 1 are instruction data for operating the data processing circuit 10 or table data used by the data processing circuit 10 according to the processing. When data to be stored in a ROM circuit are developed (that is, when a program is developed), it is easy to understand when addresses are located as in the conventional example and increase one by one. Therefore, also in the present embodiment, after a program is developed by exactly the same conventional method, the contents of data are converted to a location corresponding to a change in the address signal 67 of the address generation circuit 69.

First, when data to be stored in the ROM circuit 1 are table data or instruction data that are processed according to changes in addresses, as a first relocation method, the data may be relocated based on the relationship between the conventional address transition table shown in FIG. 11 and the address transition table of the present embodiment shown in FIG. 3. This relocation method will be explained with reference to FIG. 5A, FIG. 5B and FIG. 5C.

FIG. 5A is a flow chart showing the process of relocating data to the ROM circuit 1 according to the second embodiment of the present invention; FIG. 5B is a table showing the contents of data to be relocated following the steps shown in FIG. 5A; and FIG. 5C is a table showing the contents of data when a program is executed.

In FIG. 5A, first, a program is developed by the conventional method (S501), and by referring to the value of A1, when A1=1, a sequence exchange of high-order data with low-order data is performed (that is, data of A0=0 are exchanged with data of A0=1) (S502). Next, when A2=1, a sequence exchange of two high-order data with two low-order data is performed (that is, data of A1=0 are exchanged with data of A1=1) (S503). Moreover, when A3 =1, a sequence exchange of four high-order data with four low-order data is performed (that is, data of A2=0 are exchanged with data of A2=1) (S504). Accordingly, the contents of data at the time the data were created are relocated as shown in FIG. 5B.

In this manner, when the same operation is repeated until A (m−1)=1 (S505), the relocation of data is completed. The relocated data are placed in the memory cell array 2 of the ROM circuit 1 (S506) and executed as a program (FIG. 5C).

As described above, a program developed by the conventional method can be executed by the control circuit 68 without making any changes to the ROM circuit 1. Accordingly, when the control circuit 68 reads out a large volume of table data from the ROM circuit 1 or when instruction data to be processed in a sequential order are executed, power consumption in the semiconductor integrated circuit device can be reduced.

Now, instruction codes also include a jump instruction, a branch instruction or the like, so that there are cases where it is not sufficient to perform a processing of increasing addresses in a sequential order. When such instruction data are included, before the relocation of data is performed by the relocation method 1, jump addresses of jump instructions or branch instructions are converted based on the relationship of the address transition table. This conversion method will be explained with reference to FIG. 6A and FIG. 6B.

Figures 6A, 6B:
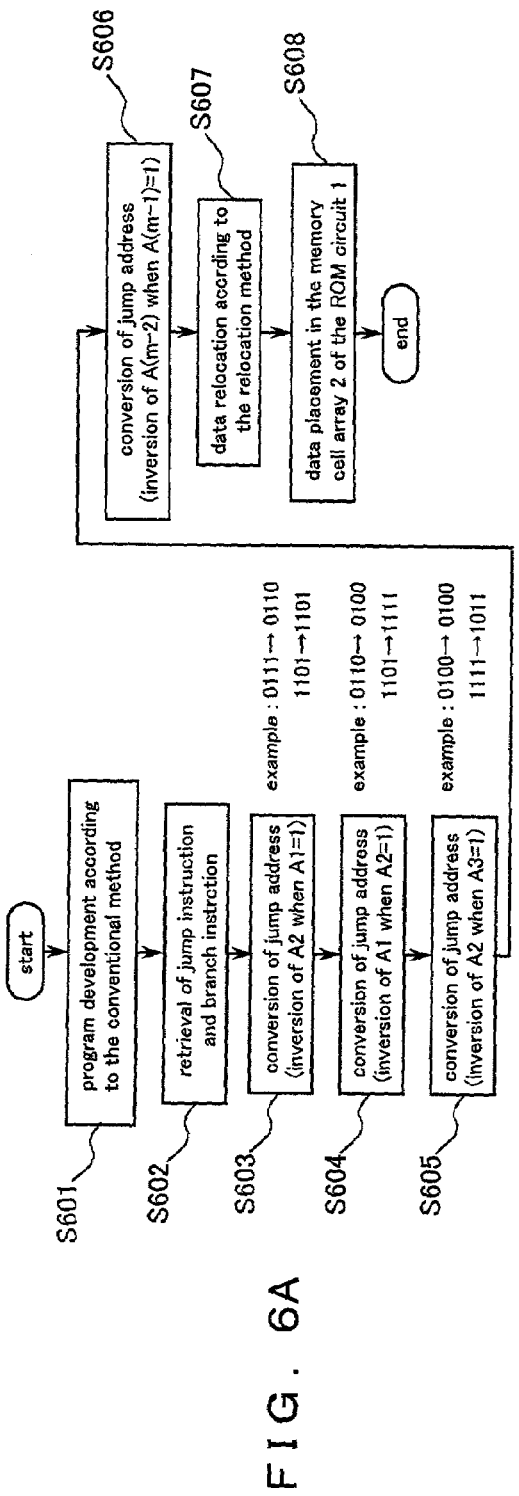
FIG. 6A is a flow chart showing the process of converting a jump address of the ROM circuit 1 according to the second embodiment of the present invention.
FIG. 6B is a table showing the contents of the jump address to be converted following the steps shown in FIG. 6A.

FIG. 6A is a flow chart showing the process of converting a jump address of the ROM circuit 1 according to the second embodiment of the present invention; and FIG. 6B is a table showing the contents of the jump address to be converted following the steps shown in FIG. 6A when a program is developed.

In FIG. 6A, first, a program is developed by the conventional method (S601), and a jump (JUMP) instruction and a branch (BRA) instruction are retrieved with respect to this program (S602). Next, with respect to the retrieved JUMP instruction or the BRA instruction, by referring to the value of bit A1 in the jump address, A0 is inverted when A1=1(the jump address of the JUMP instruction 0111 is converted to 0110, while the jump address of the BRA instruction 1101 remains as it is) (S603). Next, when the jump address of bit A1=1, A1 is inverted (the jump address of the JUMP instruction 0110 is converted to 0100, while the jump address of the BRA instruction 1101 is converted to 1111) (S604). Moreover, when the jump address of bit A3=1, A2 is inverted (the jump address of the JUMP instruction 0100 remains as it is, while the jump address of the BRA instruction 1111 is converted to 1011) (S605). Accordingly, the jump addresses at the time the data were developed are converted as shown in FIG. 6B.

In this manner, when the same operation is repeated until A (m−1)=1, the conversion of addresses is completed (S606). Thereafter, a relocation of data is performed according to the relocation method shown in FIG. 5A (S607), and the relocated data are placed in the memory cell array 2 of the ROM circuit 1 (S608).

As described above, a program developed by the conventional method can be executed by the control circuit 68 without making any changes to the ROM circuit 1. Naturally, when a jump instruction or a branch instruction is executed, a change in the address signal 67 becomes several bits.

Third Embodiment

Next, a semiconductor integrated circuit device having a built-in RAM circuit will be explained as a third embodiment of the present invention with reference to FIG. 7.

FIG. 7 is a block diagram showing the configuration of a semiconductor integrated circuit device according the third embodiment of the present invention.

It was described in the first and second embodiments that when the control circuit 68 reads out table data from the ROM circuit 1 or when instruction data to be processed in a sequential order are executed, the fact that the address signal 67 to be output from the address generation circuit 69 changes only by 1 bit is effective for reducing current consumption. This means that there are cases where it is effective for reducing current consumption even if the control circuit 68 controls a RAM circuit 81 as in the present embodiment.

For example, this is a case of using the RAM circuit 81 as a data buffer area when the data processing circuit 10 sends and receives a large amount of data to and from other circuits or a case of using the RAM circuit 81 as a save memory for the currently processing contents when another processing needs to be executed while the data processing circuit 10 is executing a certain processing. In such a case, the control circuit 68 reads out data from the RAM circuit 81 or writes data in the RAM circuit 81 continuously.

When the RAM circuit 81 is used as a data buffer area or a save memory, and the data processing circuit 10 controls the address generation circuit 69 automatically and increments or decrements the address signal 67, it is necessary only to designate the start address as the program.

Furthermore, when addresses for the RAM circuit 81 are designated consecutively by the program, the address conversion is performed by using the jump address conversion method shown in FIG. 6A. Accordingly, the program developed by the conventional method can be executed by the control circuit 68 without making any changes to the RAM circuit 81.

Moreover, there are a large number of semiconductor integrated circuit devices incorporating both a ROM circuit and a RAM circuit, so that it is extremely effective in that both circuits are controlled by the same control circuit.

Fourth Embodiment

Next, a semiconductor integrated circuit device having a built-in timer counter circuit will be explained as a fourth embodiment of the present invention with reference to FIG. 8 and FIG. 9.

Figure 8:
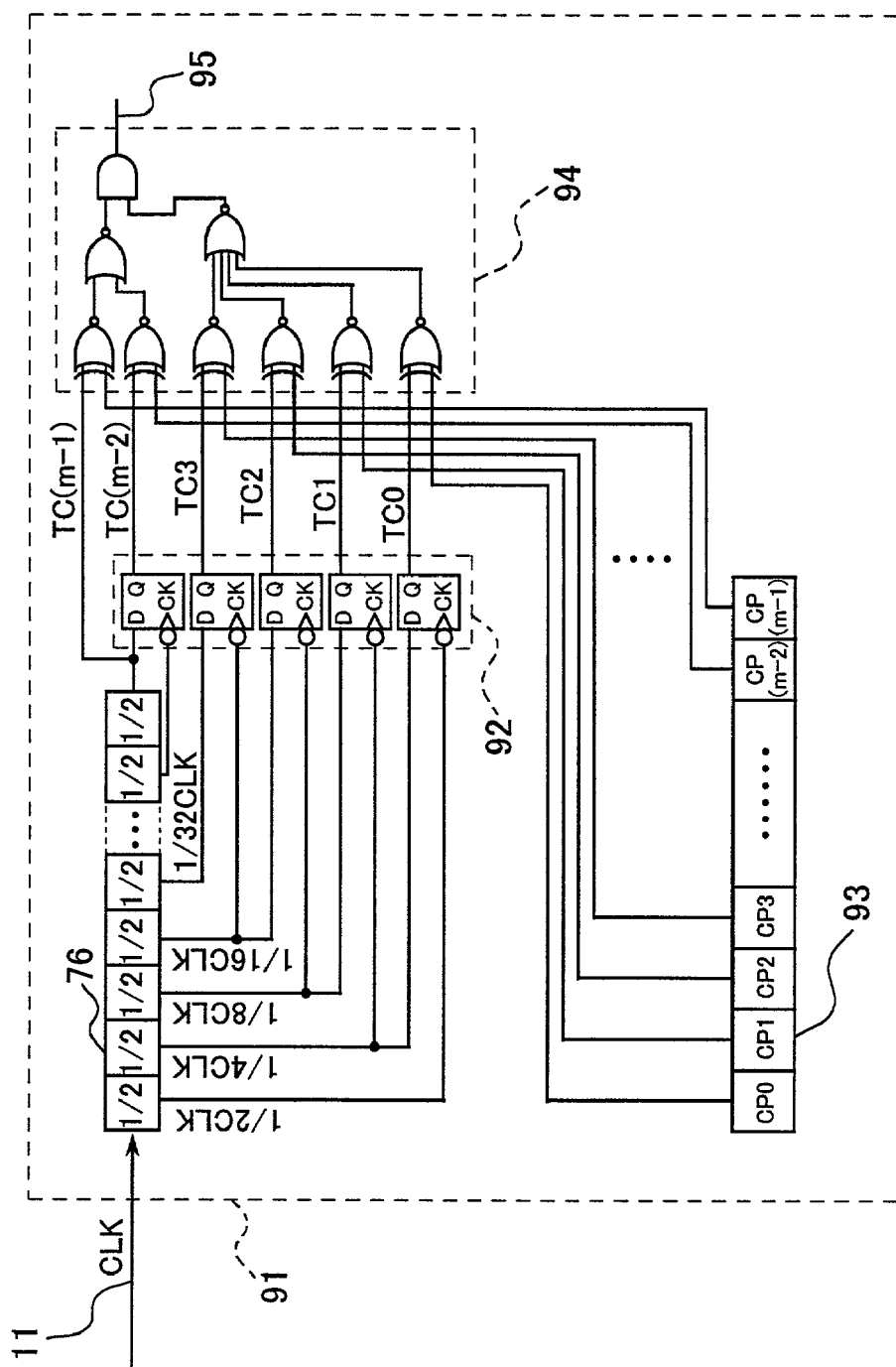
FIG. 8 is a block diagram showing the configuration of a timer counter circuit to be incorporated into a semiconductor integrated circuit device according a fourth embodiment of the present invention.

FIG. 8 is a block diagram showing the configuration of a timer counter circuit to be incorporated into a semiconductor integrated circuit device according to the fourth embodiment of the present invention.

The present embodiment differs from the first embodiment in that the circuit configuration of the address generation circuit 69 is applied as the counter circuit 76 and a counter register 92 of a timer counter circuit 91. In other words, the counter circuit 76 in the first embodiment is used as the counter circuit 76, and the sampling circuit 77 is used as the counter register 92.

In FIG. 8, the timer counter circuit 91 includes the counter circuit 76 of m stages that divides the clock 11 entering from the outside, the counter register 92 showing counted values, a compare register 93 for storing in advance time to be measured as comparison set values (CP0 to CP (m−1)) with respect to count values (TC0 to TC (m−1)), and a compare circuit 94 for comparing the count values from the counter register 92 with the comparison set values of the comparison register 93. The compare circuit 94 outputs a coincidence signal 95 (here, the logic "H" level) when the count values from the counter register 92 and the comparison set values of the compare register 93 are matched.

Here, the output values TC0 to TC (m−1) from the respective registers of the counter register 92 change only 1 bit while the counter circuit 76 is in operation, so that the operating probability of each circuit in the compare circuit 94 is reduced largely. Furthermore, the hazards described by referring to FIG. 13 cannot occur. Thus, the current consumption in the compare circuit 94 can be reduced.

Furthermore, when the time to be measured is set as the comparison set value in the compare register 93, it is easier to calculate by assuming that the counter circuit 76 performs a count-up operation by following the count-up operation of the counter circuit 16 as described in the conventional example when a program is developed. Therefore, also with respect to the timer counter circuit 91 in the present embodiment, after the comparison set value is stored in the compare register 93 by exactly the same method for developing a program in the conventional example, this value is converted to a value corresponding to a change in the count value from the counter register 92. This conversion method will be explained with reference to FIG. 9.

Figure 9:
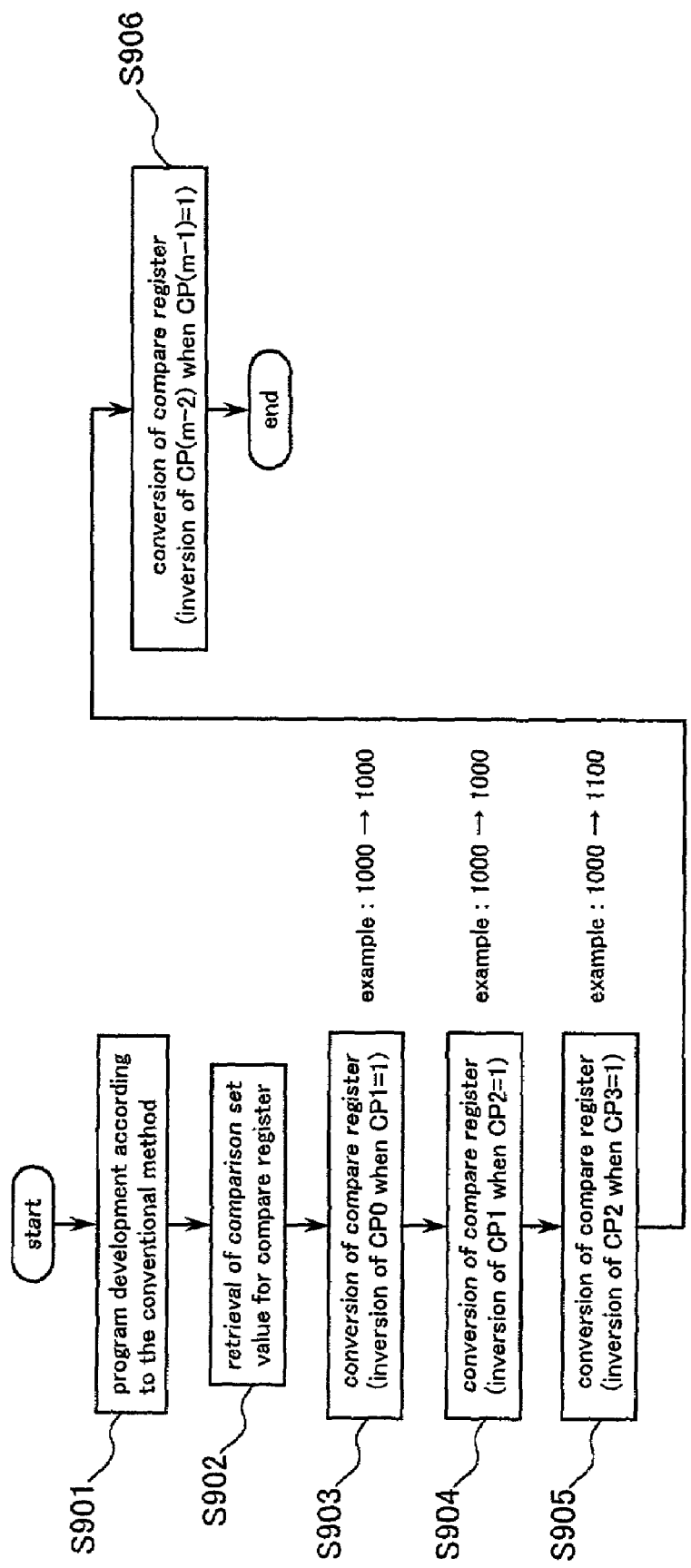
FIG. 9 is a flow chart showing the process of converting a value of a compare register 93 in FIG. 8.

FIG. 9 is a flow chart showing the process of converting a value of the compare register 93 according to the fourth embodiment of the present invention.

In FIG. 9, first, a comparison set value is stored in the compare register 93 when a program is developed by the conventional method (S901), and the comparison set value to the compare register 93 is retrieved (S902). Next, with respect to the retrieved comparison set value in the compare register 93, by referring to the value of CP1, a value of CP0 is inverted when CP1=1(S903). Next, when CP2=1, the value of CP1 is inverted (S904). Moreover, when CP3=1, the value of CP2 is inverted (S905). In this manner, when the same operation is repeated until CP (m−1)=1(S906), the conversion of the comparison set value in the compare register 93 is completed.

As a result, a program developed by the conventional method can be executed without making any changes to the compare register 93 and the compare circuit 94.

As described above, the present invention can provide a semiconductor integrated circuit device incorporating a ROM circuit, a RAM circuit or both circuits as a semiconductor memory circuit in which lower power consumption is achieved as a whole by reducing the current consumed in the address generation circuit of the control circuit and the address decoding circuit of the semiconductor memory circuit when the control circuit performs a data access by consecutive addresses to the semiconductor memory circuit.

Furthermore, when a semiconductor integrated circuit device has a built-in timer counter circuit, a semiconductor integrated circuit device can be provided in which lower power consumption is achieved as a whole by reducing the current consumed in the compare register.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor integrated circuit device incorporating a semiconductor memory circuit and a control circuit for controlling a data access to the semiconductor memory circuit,
wherein the control circuit includes an address generation circuit that divides a clock to be input, performs a phase adjustment by sampling the divided clock and generates an address signal of several bits, and the address generation circuit outputs the address signal of several bits in which only a value of 1 bit changes in a sequential order when a data access by consecutive addresses is performed on the semiconductor memory circuit.

2. The semiconductor integrated circuit device according to claim 1, wherein the semiconductor memory circuit includes at least one selected from a ROM circuit and a RAM circuit.

3. The semiconductor integrated circuit device according to claim 1, further comprising means for converting a location of data stored in the semiconductor memory circuit into a location corresponding to a change in the address signal from the address generation circuit.

4. A semiconductor integrated circuit device incorporating a semiconductor memory circuit and a control circuit for controlling a data access to the semiconductor memory circuit,
wherein the control circuit includes an address generation circuit that divides a clock to be input and generates an address signal of several (m) bits in which bit 0 is set as a lowest-order bit, and the address generation circuit outputs the address signal of several bits in which only a value of 1 bit changes in a sequential order by dividing the clock by $(1/4) \times (1/2)^i$ to generate bit i (i=0 to (m−1)) and delaying a phase of each bit by $1/4$ cycle with respect to a cycle of an immediately lower-order bit when a data access by consecutive addresses is performed on the semiconductor memory circuit.

5. The semiconductor integrated circuit device according to claim 4, wherein the semiconductor memory circuit includes at least one selected from a ROM circuit and a RAM circuit.

6. The semiconductor integrated circuit device according to claim 4, further comprising means for converting a location of data stored in the semiconductor memory circuit into a location corresponding to a change in the address signal from the address generation circuit.

7. A semiconductor integrated circuit device incorporating a timer counter circuit, the timer counter circuit comprising:
a counter circuit that divides a clock to be input by a predetermined division rate and outputs a plurality of divided clocks,
a counter register that stores a divided clock corresponding to an immediately higher-order bit as data based on a divided clock corresponding to a low-order bit to be output from the counter circuit and outputs a count value in which only a value of 1 bit changes in a sequential order,
a compare register that stores a predetermined comparison set value, and
a compare circuit that compares the count value from the counter register with the predetermined comparison set value from the compare register and outputs a comparison result thereof.

8. The semiconductor integrated circuit device according to claim 7, further comprising means for converting the comparison set value stored in the compare register into a value corresponding to a change in the count value from the counter register.

* * * * *